US006799855B2

(12) United States Patent
Petzold

(10) Patent No.: US 6,799,855 B2
(45) Date of Patent: Oct. 5, 2004

(54) EXTERNAL MIRROR ON A MOTOR VEHICLE

(75) Inventor: Bernd Petzold, Groebenzell (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 10/275,297

(22) PCT Filed: May 4, 2001

(86) PCT No.: PCT/EP01/05067

§ 371 (c)(1), (2), (4) Date: Nov. 4, 2002

(87) PCT Pub. No.: WO01/85492

PCT Pub. Date: Nov. 15, 2001

(65) Prior Publication Data

US 2003/0090819 A1 May 15, 2003

(30) Foreign Application Priority Data

May 6, 2000 (DE) ........................................ 100 22 064

(51) Int. Cl.[7] .................................................. G02B 5/08
(52) U.S. Cl. ....................................................... 359/841
(58) Field of Search ................................ 359/841, 871, 359/872, 877

(56) References Cited

U.S. PATENT DOCUMENTS

| | | | | |
|---|---|---|---|---|
| 4,915,493 | A | 4/1990 | Fisher et al. | |
| 5,166,825 | A | 11/1992 | Fujie et al. | |
| 6,170,957 | B1 * | 1/2001 | Kaspar | 359/877 |

FOREIGN PATENT DOCUMENTS

| | | |
|---|---|---|
| DE | 19724725 | 2/1999 |
| DE | 19841551 | 4/2000 |
| WO | 00/70374 | 11/2000 |

* cited by examiner

*Primary Examiner*—Euncha P. Cherry
(74) *Attorney, Agent, or Firm*—Crowell & Moring LLP

(57) ABSTRACT

An exterior rear view mirror is known in the art in which cables that are guided through an opening to a door of the motor vehicle are soldered to a printed circuit board. This design has the drawback that assembly is time-consuming. The present invention provides an exterior rear view mirror that is simple to mount. To achieve this, the electrical connection consists of extension sections of the printed circuit board. At least one section of this extension of the printed circuit board is torsionally soft, such that the exterior rear view mirror can be adjusted toward the motor vehicle and away therefrom.

13 Claims, 2 Drawing Sheets

EXTERNAL MIRROR ON A MOTOR VEHICLE

This application claims the priority of International Application No. PCT/EP01/05067, filed May 4, 2001, and German Patent Document No. 100 22 064.9, filed May 6, 2000, the disclosures of which are both incorporated by reference herein.

BACKGROUND AND SUMMARY OF THE INVENTION

The present invention relates to an exterior rear view mirror of a motor vehicle.

It is known in the art to adjust exterior rear view mirrors from a position protruding from a motor vehicle in the direction toward the vehicle, for instance, to drive the vehicle through a car wash without damaging the exterior mirrors.

It is also known in the art to mount a mirror in an exterior rear view mirror housing in such a way that the position of the mirror can be adjusted via an electric drive. Electric power is supplied, for instance, via lead frame technology, in which the conductor tracks are embedded in a plastic plate. The conductors can be made, for instance, of copper.

To connect this network of copper tracks with a bus system of the motor vehicle, cables are soldered to the lead frame or the printed circuit board. After a joint has been mounted to the housing of the exterior rear view mirror, these cables must be guided through a passage in the joint and through the mirror base that is adjacent to the joint. To connect these cables with a terminal, e.g., a plug contact, which is arranged, for instance, in a cavity inside a vehicle door, matching connectors must be fastened to the cable ends.

This design has the drawback that it is time-consuming to solder the cables to the printed circuit board, to guide the cables through the mirror joint and the mirror base, and to connect the cable ends with a connector that must subsequently be inserted into a plug contact.

The object of the invention is to design an exterior rear view mirror for a motor vehicle, which is simple to mount.

In the exterior rear view mirror according to the invention, the cables to be soldered to the lead frame are replaced by an elongated structure that is an extension of the conductor tracks of the printed circuit board and that can easily be guided through the joint and base of the exterior rear view mirror.

To enable the exterior rear view mirror to be adjusted from its operating position to a position that is closer to the chassis of the motor vehicle, the conductor tracks serving as a cable substitute are torsionally soft, so that the conductor tracks are sufficiently flexible to permit the exterior rearview mirror to be adjusted.

In one advantageous embodiment, a torsionally soft design of the extension section of the printed circuit board is achieved by arranging the conductors in a meander shape, at least in the area of the adjustment motion of the exterior rear view mirror.

In another advantageous embodiment, the twistable conductors are wave-shaped. This design permits a reduction in the overall volume while affording the same torsional softness.

In another advantageous embodiment, the individual conductor tracks are insulated from one another by enclosing them with an insulating plastic, e.g., a flexible dipping varnish. In a further advantageous embodiment, the insulation is provided only at the reversal points, such that the insulation applied at these points simultaneously acts as a spacer.

In another advantageous embodiment, the ends of the conductor tracks are shaped as connectors.

BRIEF DESCRIPTION OF THE DRAWINGS

Embodiments of the invention will now be described in greater detail, by way of example, with reference to the Figures in which.

DETAILED DESCRIPTION OF THE DRAWINGS

Figure 1:
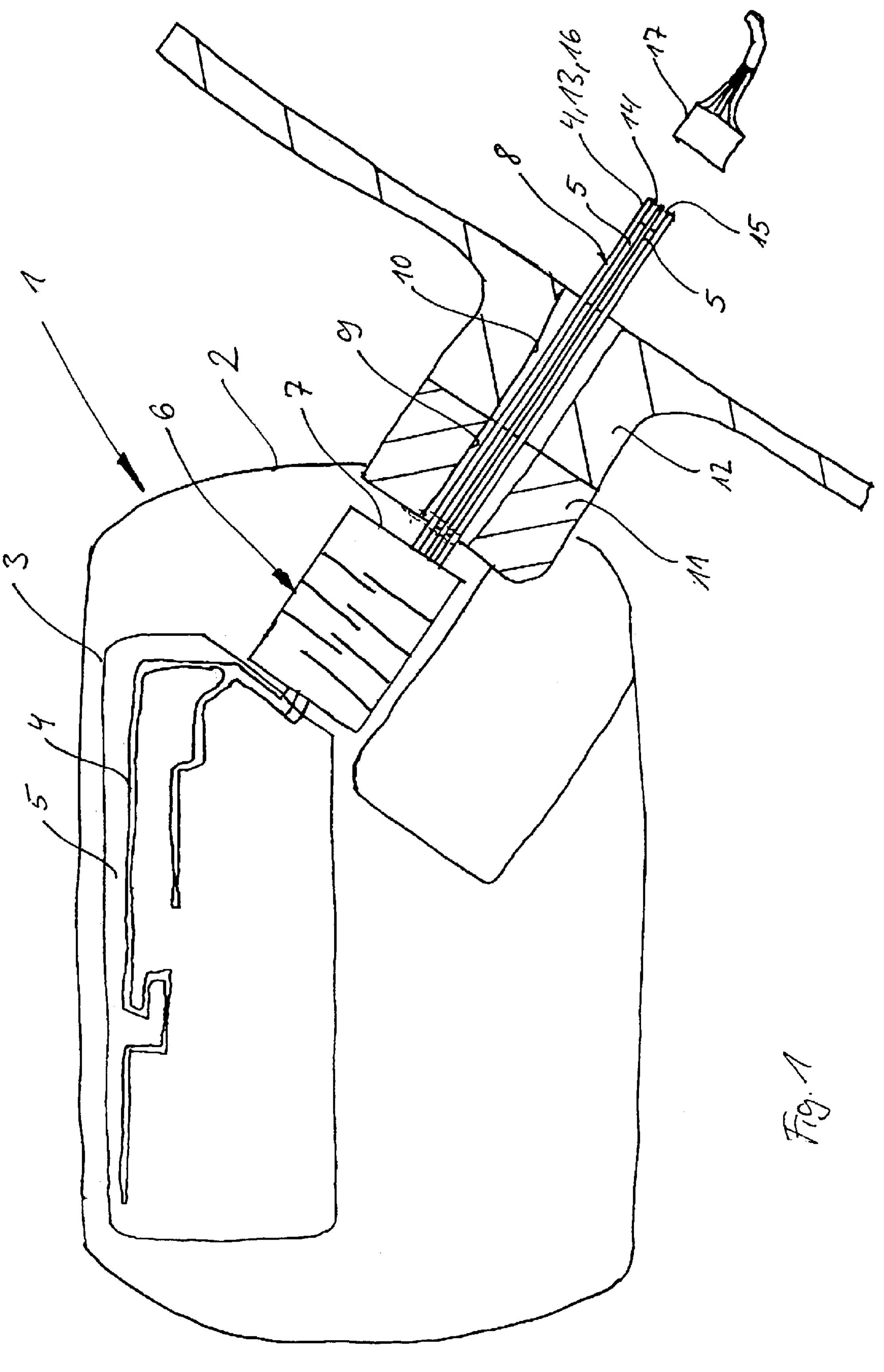
FIG. 1 is a longitudinal section through an exterior rear view mirror of a motor vehicle.

FIG. 1 shows an exterior rear view mirror 1, which can be mounted, for instance to a door of a motor vehicle (not depicted). The exterior rear view mirror 1 is provided with a housing 2, which holds a printed circuit board or a lead frame 3. The printed circuit board 3 is provided with conductor tracks 4 which are embedded in a plastic material 5.

Figures 2, 3:
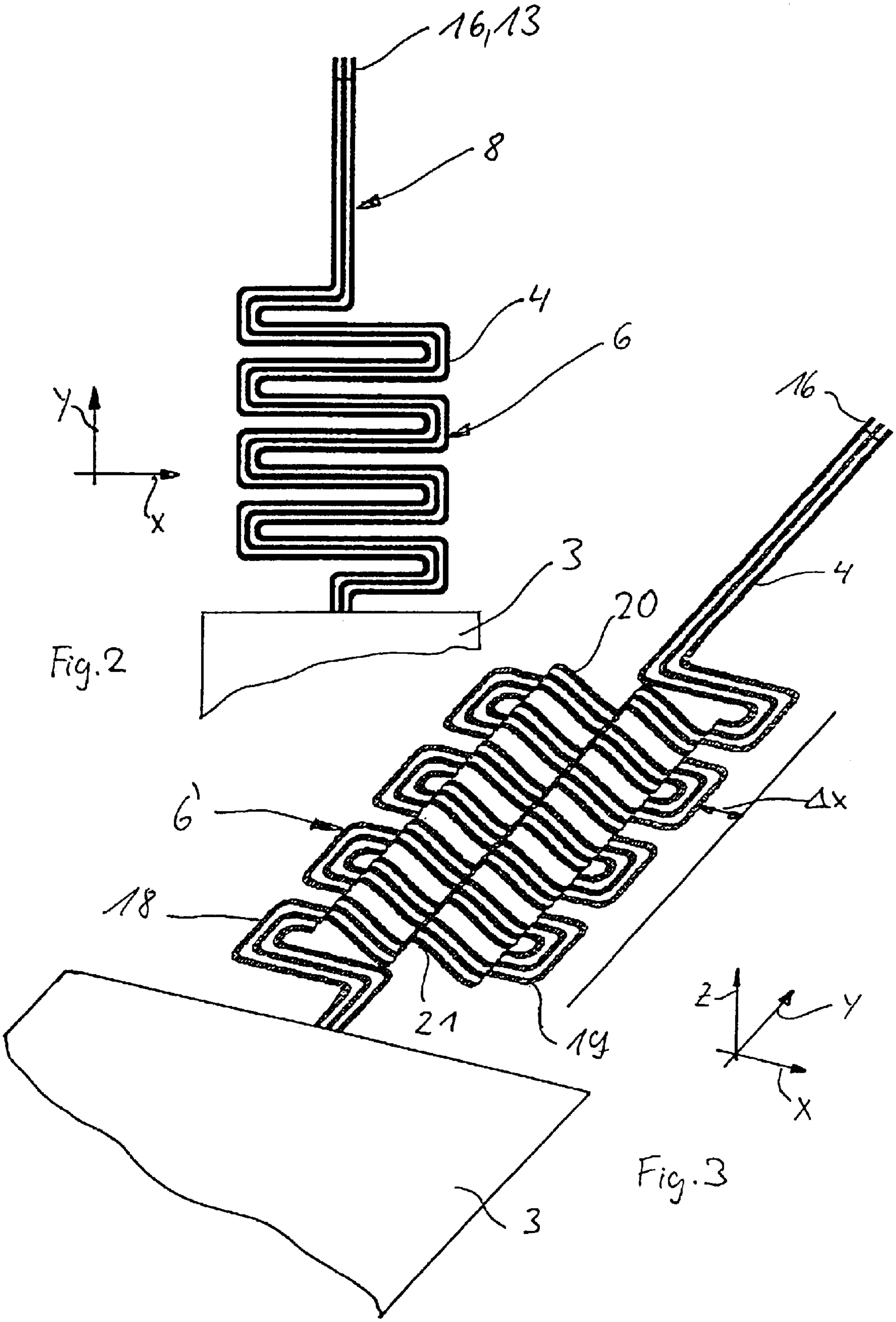
FIG. 2 is a top view of a first embodiment of an extension of a printed circuit board.
FIG. 3 is a perspective view from the side of a second embodiment of an extension of the printed circuit board.

A section 6, in which the conductors 4 coming from the printed circuit board 3 are arranged in a meander shape, is connected to printed circuit board 3 as shown in FIGS. 2 and 3, such that the conductors 4 in this section 6 of printed circuit board 3 are torsionally soft. In this printed circuit board section 6, the exterior rear view mirror I can thus be folded down or rotated.

At one end 7 of the printed circuit board section 6, the conductor tracks 4 are arranged in a straight line and parallel to one another in a section 8. The printed circuit board section 8 is guided through openings 9 and 10 formed in a joint 11 and a mirror base 12.

In the embodiment shown, the three conductor tracks 4 shown in FIG. 1 are insulated from one another by plastic 5. The free ends 13 of the conductor tracks 4 have no plastic 5 in the two gaps 14 and 15, such that the free ends 13 of the conductor tracks 4 can be used as a connector 16. Connector 16 can be inserted into a terminal 17 designed, for instance, as a plug contact. Via terminal 17, the conductor tracks 4 are linked, e.g., with a bus system of the motor vehicle.

FIG. 2 is an enlargement of the printed circuit board section 6, which clearly shows the meander-shaped course of conductors 4. In FIG. 2, the conductor tracks 4 extend in sections 6 and 8 in a horizontal x-y plane.

The printed circuit board section 6' shown in FIG. 3 is distinguished from the printed circuit board section 6 depicted in FIG. 2 in that, in addition to the end sections 18 and 19, which lie in the x-y plane, two waves or arcs 20 and 21 are formed in the z-direction. These arcs 20, 21 result in a shortening $\Delta x$ in the x-direction while affording the same torsional softness in printed circuit board section 6' and thereby reduce the space required for printed circuit board section 6 in the x-direction.

What is claimed is:

1. An exterior rear view mirror for a motor vehicle, adjustable from a position protruding from the motor vehicle to a position closer to the motor vehicle, comprising a housing to receive a mirror, wherein said housing encloses a printed circuit board with conductor tracks embedded in plastic, a joint for adjusting the exterior rear view mirror, wherein said joint is arranged between the housing of the exterior rear view mirror and a mirror base mounted to the chassis, and an electrical connection extending from the printed circuit board to a terminal located in the vehicle, wherein the electrical connection consists of extended sections of the printed circuit board and wherein at least one section of this extension of the printed circuit board is torsionally soft such that the exterior rear view mirror can be adjusted toward the motor vehicle and away therefrom.

2. The exterior rear view mirror as claimed in claim 1, wherein the torsionally soft section of the printed circuit board comprises conductor tracks that are arranged in a meander shape.

3. The exterior rear view mirror as claimed in claim 1, wherein the torsionally soft section of the printed circuit board extends in a single plane.

4. The exterior rear view mirror as claimed in claim 2, wherein additional curvatures extending perpendicularly to the meander-shaped course of the conductor tracks are provided in the torsionally soft section of the printed circuit board.

5. The exterior rear view mirror as claimed in claim 1, wherein a section in which the conductor tracks extend in a straight line and parallel to one another adjoins the torsionally soft section of the printed circuit board.

6. The exterior rear view mirror as claimed in claim 1, wherein the conductor tracks of the extended sections of the printed circuit board are insulated from one another by a plastic material over their entire length or only a part thereof.

7. The exterior rear view mirror as claimed in claim 6, wherein the plastic material is provided in the torsionally soft section at least in end areas.

8. The exterior rear view mirror as claimed in claim 1, wherein free ends of the conductor tracks function as a connector.

9. The exterior rear view mirror as claimed in claim 2, wherein the torsionally soft section of the printed circuit board extends in a single plane.

10. An exterior rear view mirror for a motor vehicle, comprising:

a printed circuit board;

a housing wherein the printed circuit board is enclosed within the housing;

a mirror base;

a joint arranged between the housing and the mirror base; and an electrical connection extending from the printed circuit board through the joint and the mirror base wherein the electrical connection consists of at least one extended section of the printed circuit board and wherein the at least one extended section is torsionally soft.

11. The exterior rear view mirror as claimed in claim 10, wherein the torsionally soft section of the printed circuit board comprises conductor tracks that are arranged in a meander shape.

12. The exterior rear view mirror as claimed in claim 10, wherein the torsionally soft section of the printed circuit board extends in a single plane.

13. The exterior rear view mirror as claimed in claim 11, wherein additional curvatures extending perpendicularly to the meander-shaped course of the conductor tracks are provided in the torsionally soft section of the printed circuit board.

* * * * *